United States Patent [19]
Murphy et al.

[11] Patent Number: 5,848,703
[45] Date of Patent: Dec. 15, 1998

[54] TRAY FOR INTEGRATED CIRCUITS

[75] Inventors: Robert H. Murphy; Roy E. Maston, III, both of Amherst, N.H.

[73] Assignee: R. H. Murphy Co., Inc., Amherst, N.H.

[21] Appl. No.: 954,736

[22] Filed: Oct. 20, 1997

[51] Int. Cl.[6] .................................................. B65D 73/02
[52] U.S. Cl. .......................................... 206/725; 206/486
[58] Field of Search .................................... 206/719, 724, 206/725, 486, 332, 564

[56] References Cited

U.S. PATENT DOCUMENTS

| | | | |
|---|---|---|---|
| 4,681,221 | 7/1987 | Chickanosky et al. | 206/486 X |
| 4,767,984 | 8/1988 | Bakker | 206/724 X |
| 4,881,639 | 11/1989 | Matsuoka et al. | 206/724 |
| 5,080,228 | 1/1992 | Maston, III et al. | 206/724 X |
| 5,103,976 | 4/1992 | Murphy | 206/725 X |
| 5,203,454 | 4/1993 | Strong . | |
| 5,246,129 | 9/1993 | Small et al. . | |
| 5,375,710 | 12/1994 | Hayakawa et al. | 206/724 |
| 5,392,932 | 2/1995 | Vongfuangfoo . | |
| 5,400,904 | 3/1995 | Maston, III et al. | 206/725 |
| 5,407,068 | 4/1995 | Strong . | |
| 5,450,959 | 9/1995 | Philippi . | |
| 5,492,223 | 2/1996 | Boardman . | |
| 5,551,572 | 9/1996 | Nemoto . | |
| 5,636,745 | 6/1997 | Crisp et al. . | |
| 5,746,319 | 5/1998 | Murphy | 206/725 |

*Primary Examiner*—Bryon P. Gehman
*Attorney, Agent, or Firm*—Pearson & Pearson

[57] ABSTRACT

A tray for storage and transportation of multiple staggered integrated circuit components, each having a planar housing and plurality of terminal pins arranged in spaced rows. The tray has a framework for supporting upstanding ribs that interfit between adjacent integrated circuit components. Each upstanding rib lies along an axis in one of two sets of intersecting axes and aligns with and fits between certain spaced rows to position the terminal pin in precise alignment with the tray. The rib axes are intersecting and oblique to the general tray orientation. Positioning fingers provide initial positioning to align the terminal pins and ribs. Pedestals define a support plane and support the integrated circuit with the terminal pins spaced from a base plate.

20 Claims, 5 Drawing Sheets

TRAY FOR INTEGRATED CIRCUITS

BACKGROUND OF THE INVENTION

1. Field of the Invention

This invention generally relates to integrated circuits and more specifically to devices for the storage and transport of such integrated circuits.

2. Description of Related Art

The storage and transportation of semiconductor components have become important considerations in the production of electronic assemblies, especially as semiconductor components have matured from inexpensive, elementary circuit elements into expensive, sophisticated, complex circuit components. As these components have grown in complexity, they have become more susceptible to damage from a number of external influences, such as mechanical shock and discharges of accumulated electrostatic charge. Consequently, there have been many changes in the transportation, assembly and testing procedures that in electronic assembly production facilities utilize. Such procedures, when properly implemented, now contribute significantly to the success of such electronic assembly facilities.

U.S. Pat. No. 5,103,976 to Murphy and assigned to the same assignee as this application discloses a tray for integrated circuits with supporting ribs. This tray is adapted for carrying a plurality of PGA integrated circuit components. As known, a pin grid array (PGA) integrated circuit component typically has a thin planar housing of a ceramic or other material for containing a semiconductor substrate and related circuitry. Terminal pins extend perpendicularly to one planar surface of the housing. The terminal pins define an array or matrix of columns and rows with an industry-standard spacing. Currently the spacing is 0.1 inch. PGA integrate circuit components come in myriad sizes that are defined alternatively by the size of the housing (from a 1-inch square to a 2.5-inch square) or by the size of the matrix (from a 9×9 terminal pin matrix to a 25×25 terminal pin matrix).

The foregoing U.S. Pat. No. 5,103,976 discloses a tray for storing and transporting multiple pin grid array circuit components. The tray has a lattice framework that defines discrete storage pocket areas. Each storage pocket area comprises a base support that spans portions of the framework and includes upstanding ribs that engage the integrated circuit component. Depending terminal pins from the housing lie between individual ones of the upstanding ribs and the ribs engage the bottom of the housing to support the integrated circuit.

As such integrated circuits are typically manually loaded into a tray, U.S. Pat. No. 5,103,976 also discloses a template that can be placed over the top of the tray storage pocket areas to assist in aligning the PGA integrated circuit with the ribs thereby to minimize damage. Thus this structure additionally precisely locates the terminal pins with respect to the tray to facilitate a robotic handling that is typically used when an integrated circuit is removed from the tray and inserted in an electronic component.

More recently a new integrated circuit component, known as a "staggered chip", has become popular. Like a PGA integrated circuit component, it comprises a thin planar housing of a ceramic or other material for containing a semi-conductor substrate and related circuitry. Terminal pins extend perpendicularly through the planar surface of the housing. In the staggered integrated circuit, the pins are localized to bands at the periphery of the integrated circuit chip in a plurality of rows with the pins in adjacent rows being offset by one-half pin spacing, typical pin spacing being 0.10 inch. Moreover the staggered integrated circuit has large volumes of a given physical size.

The tray in U.S. Pat. No. 5,103,976 is adapted for receiving PGA circuit components in which the terminal rows are parallel to the edges of the integrated circuit. The staggered integrated circuit, however, aligns the pins along rows that lie along terminal pin axes that are inclined 45° to the edge of the terminal housing. U.S. Pat. No. 08/777,289, Dec. 27, 1996 for a tray for integrated circuits depicts a variation on the tray in which the ribs lie along rib axes that are at 45°. A tray having this construction is adapted to receive staggered integrated circuit components. However it has been found that the manual loading procedures for staggered integrated circuit components is not efficient. The use of a template becomes inefficient because templates are subject to loss and require additional manipulation. Moreover the templates do not always provide an efficient placement of the integrated circuit components on the tray. Moreover in this tray the upstanding ribs provide two functions, namely: (1) support of the bottom surface of the integrated circuit housing and (2) precise positioning of the terminal pins relative to the tray. It is possible that, prior to loading in the tray, the terminal pins can become misaligned. Typically this occurs during other handling prior to the loading operation. In cases of significant misalignment, as for example about one-half or more of a row spacing, the manual loading procedures are readily adapted to allow the insertion of the staggered integrated circuit tray can cause interference between the top of an upstanding rib and the terminal pins and bend the terminal pin over. If the applied force is sufficient, the pin can be bent solidly against the bottom surface and prevent any straightening of the pin. When this occurs, as will be apparent, the integrated circuit is no longer useful and must be discarded.

It also is desirable that any device for transporting and storing staggered integrated circuit components provide other desirable benefits. For example, it is possible for any number of external forces to transfer to the terminal pins with force components directed along and transversely to the terminal pins. To some degree, the device should protect the terminal pins from damage due to such mechanical shock during transport. The device also should prevent the accumulation of an electrostatic charge on the PGA integrated circuit component to avoid a potential discharge and damage.

SUMMARY OF THE INVENTION

Therefore it is an object of this invention to provide an economical device for the transportation and storage of electronic components, particularly pin grid array integrated circuit components.

Another object of this invention is to provide a device for storing and transporting electronic components, particularly pin grid array and like integrated circuit components, that accurately positions the terminal pins from such components.

Another object of this invention is to provide a storage and transportation device for electronic components, particularly pin grid array and like integrated circuit components, that protects terminal pins emanating from such components from mechanical shock.

Still another object of this invention is to provide a device for storing and transporting electronic components, particularly pin grid array and like integrated circuit components, that minimizes stresses that can be applied to terminal pins emanating from such components.

Yet another object of this invention is to provide a device for storing and transporting electronic components, particularly pin grid array and like integrated circuit components, that is stackable with similar devices thereby to enable the shipment and storage of a large number of components in a single package.

Yet still another object of this invention is to provide a device for storing and transporting electronic components, particularly pin grid array and like integrated circuit components, that facilitates both manual and automated handling techniques for such electronic components.

In accordance with this invention a tray stores at least one integrated circuit component wherein each component has a planar, rectangular housing with spaced planar surfaces bounded by edges and an array of spaced terminal pins of predetermined length extending essentially normally to one planar surface of the housing in spaced parallel rows that are oblique to the housing edges. The tray includes a dimensionally stable framework for defining at least one storage pocket area for receiving a single integrated circuit component. The framework carries a base support in each storage pocket area supported by the framework. Corner supports extend normally to the base support in register with the corners of a housing for supporting the integrated circuit relative to the base support and precisely positioning the terminal pins relative to the tray. Each corner support comprises a first positioning structure for orienting the terminal pins precisely with respect to the tray. A second positioning structure engages the housing to guide the terminal pins into register with the first positioning structure. A housing support engages the housing thereby to position the integrated circuit component in a direction transverse to the housing and the base plate.

In accordance with another aspect of this invention a tray stores a plurality of integrated circuit components. Each integrated circuit component has a planar square housing with spaced planar surfaces bounded by edges and an array of spaced terminal pins of a predetermined length extending essentially normally to one planar surface of the housing and spaced parallel rows that are oblique to the housing edges. The tray includes a dimensionally stable, rigid lattice framework that defines a plurality of storage pocket areas. A planar base plate spans portions of the framework defining each storage pocket area and the base plates in the plurality of storage pocket areas are coplanar. A corner support extends normally to the base plate to register with the corners of a housing. Each corner support comprises first and second upstanding positioning fingers, a plurality of upstanding support pedestals and a pair of upstanding ribs. The first and second upstanding positioning fingers extend from the base plate and have an edge parallel to and spaced from the base plate by a first dimension. Each of the first and second fingers lie along intersecting finger axes. The upstanding support pedestals are located at each of the fingers and each have a planar surface parallel to and spaced from the base plate by a second dimension. All the planar surfaces in a corner support are coplanar. The upstanding ribs extend along axes parallel to and spaced from a diagonal intersecting diagonally positioned corner support. Each rib axis defines the position of one rib at each corner structure. Each rib has an edge parallel to the base plate and spaced therefrom by a third dimension.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
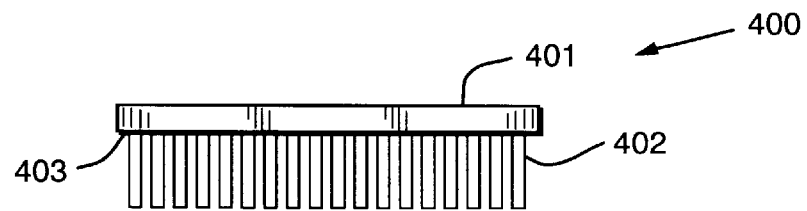
FIG. 1 is a side view of a pin grid array like integrated circuit component.
Figure 2:
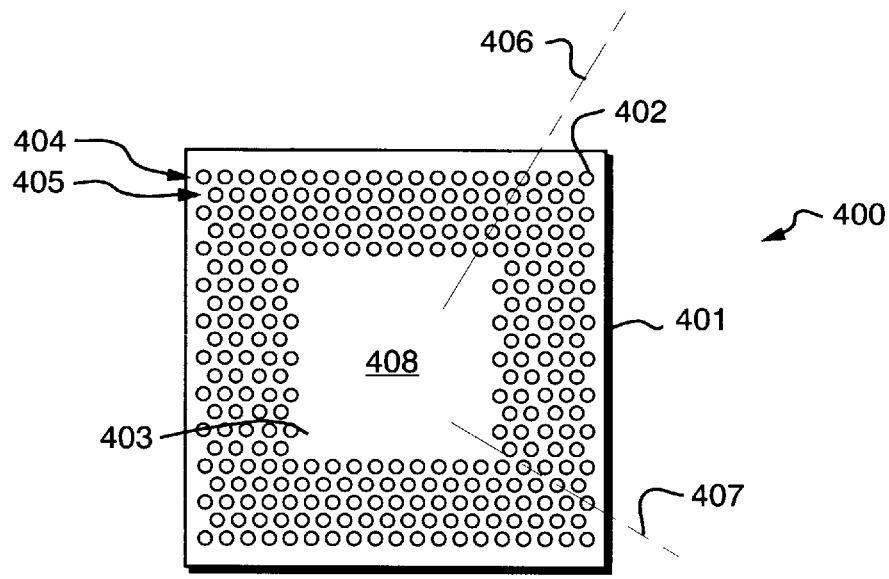
FIG. 2 is a bottom view of the integrated circuit component of FIG. 1.
Figure 3:
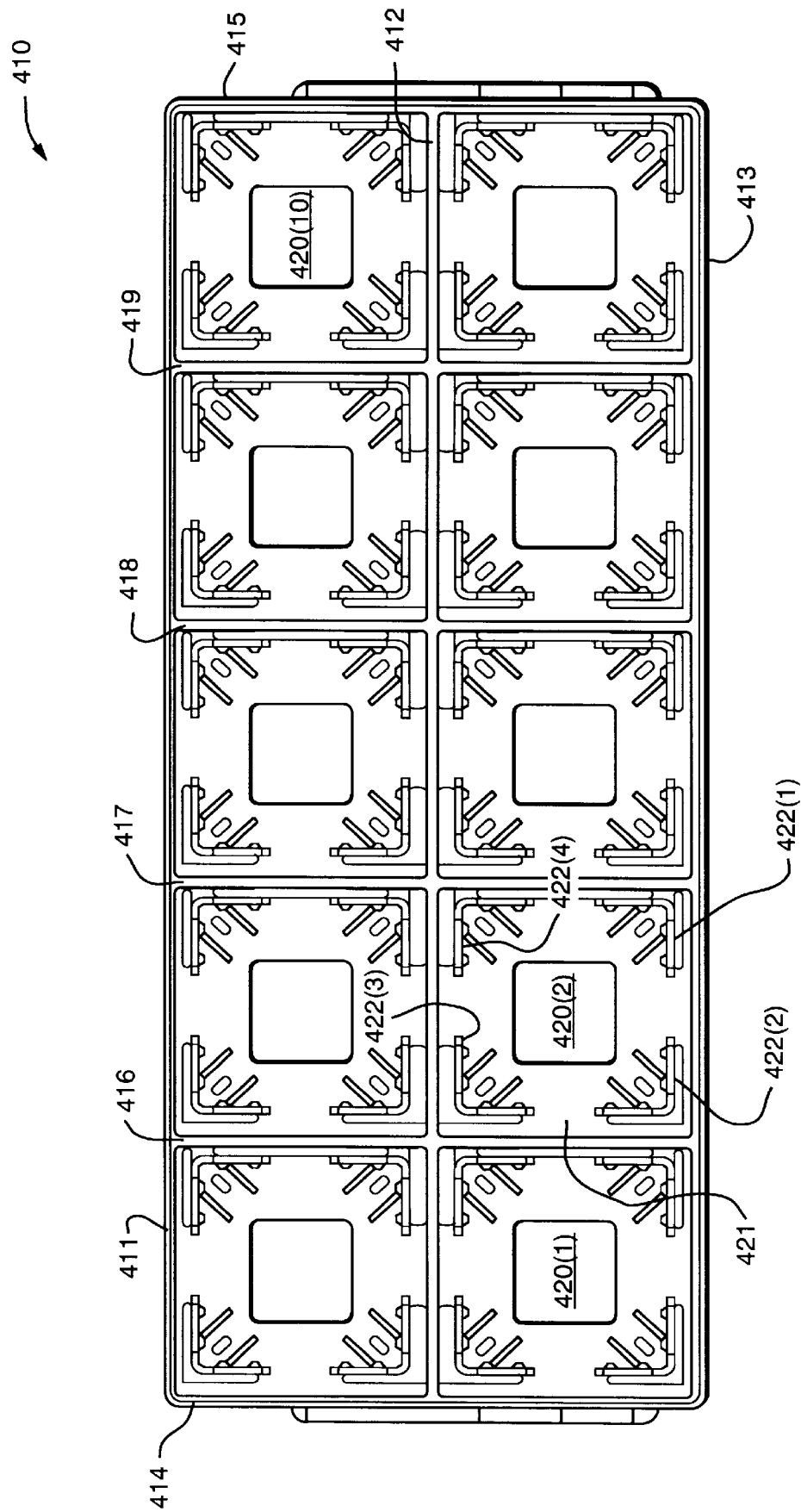
FIG. 3 is a top view of a tray for storing a plurality of integrated circuit components of FIGS. 1 and 2 in discrete storage pockets.

FIGS. 1 and 2 depict a pin grid array like integrated circuit component 400, commonly known as a "staggered" integrated circuit component that comprises a thin planar square housing 401 and an array of terminal pins 402 that depend from the bottom planar surface 403 of the housing 401. The terminal pins 402 are arranged in an array about the periphery of the bottom surface 403. In one particular embodiment the terminal pins define five rows of pins about the periphery of the bottom surface 403. An outer row 404 contains nineteen pins on each side on 0.100 mm spacing and alternate rows 405 that contains eighteen pins spaced equally but offset one-half the terminal pin spacing. Consequently the terminal pins define oblique terminal pin axes such as an axis 406 or an axis 407 in FIG. 2 with respect to the edges of the housing 401. These axes intersect at right angles. A central area 408 is free of any terminal pins.

After integrated circuits such, as the staggered integrated circuit 400 in FIGS. 1 and 2, are manufactured, they are manually loaded in a tray for transport. Manual loading subjects the integrated circuits to potential terminal pin damage. Specifically, an individual may force the entire integrated circuit 400 toward a tray without first having good alignment between the terminal pins in the upstanding ribs. Misalignment can be a result of total integrated circuit misalignment with a storage pocket area or from some manufacturing process that bends one or more terminal pins slightly.

FIGS. 3 through 6 depict a structure that uses the positioning capabilities of the upstanding ribs but minimizes potential damage. More specifically, the tray 410 in FIG. 3 includes a plurality of spaced parallel beams 411, 412 and 413. They form a lattice like framework with transverse end beams 414 and 415 and a plurality of intermediate, spaced parallel transverse beams 416, 417, 418 and 419. The resulting lattice framework defines an array of storage pocket areas. In this particular example the lattice framework defines ten storage pocket areas with three particular storage pocket areas 420 (1), 420 (2) and 420 (10) being specifically identified. With this construction the tray 410 is a planar structure that can carry up to ten staggered integrated circuits in individual ones of the storage pocket areas 420. Moreover the construction of the beams enables tray stacking as known in the art.

Figure 4:
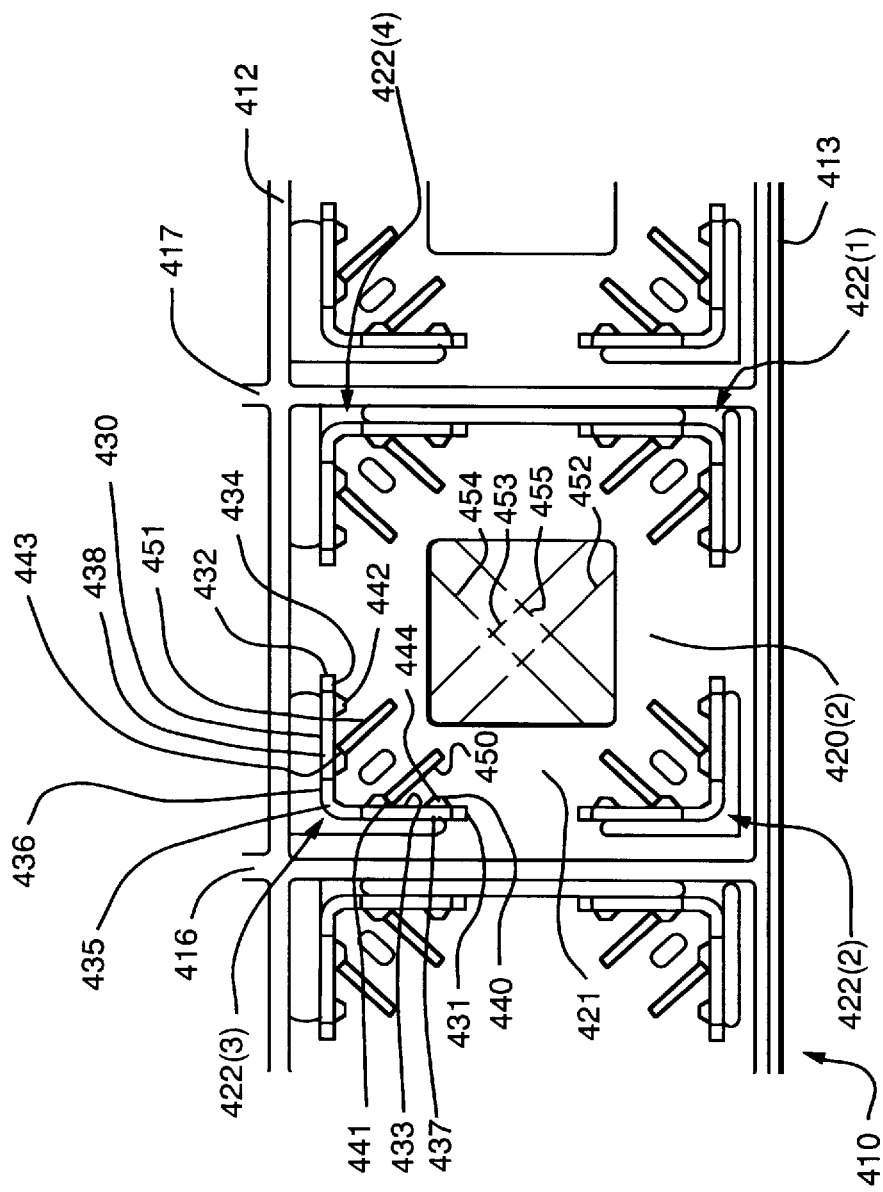
FIG. 4 is a top plan view of one storage pocket area in FIG. 3.

FIG. 4 shows the storage pocket area 420 (2) in detail. It is formed by the transverse beams 412, 413, 416 and 417. A base plate 421 traverses the storage pocket area 420 (2) and is affixed to one or more of the transverse beams 412, 413, 416 and 417 through a plurality of web structures 421A. The base plate 421 carries four corner supports designated 422 (1) through 422 (4). The corner supports 422 are positioned in the base plate 421 to be in register with the corners of the housing 401 in FIGS. 1 and 2.

Figure 5:
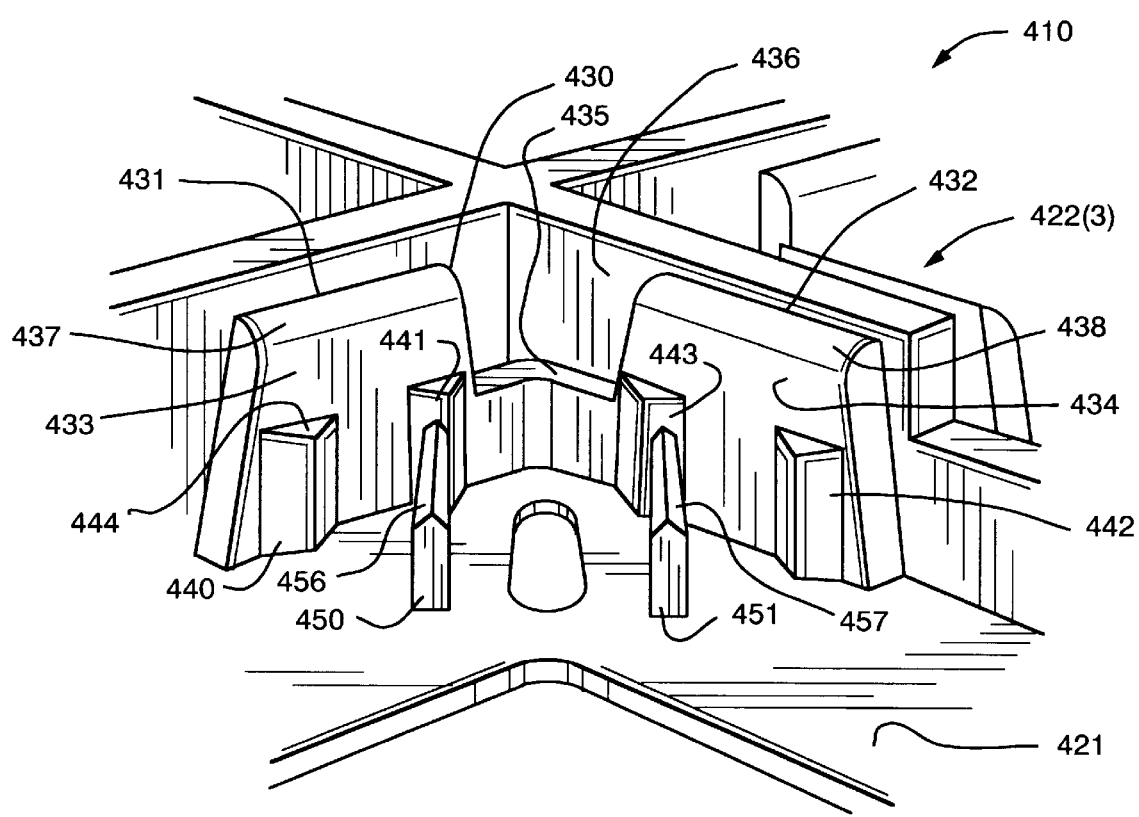
FIG. 5 is an enlarged perspective view of a corner structure in the storage pocket of FIG. 3.

Each of the four corner supports 422 is identical and the construction is best understood by referring to the view of the corner support 422 (3) in FIG. 4 and the perspective view in FIG. 5. At this corner support an outer wall section 430 extends vertically from the base plate 421 and includes first and second positioning fingers 431 and 432. Inner vertical surfaces 433 and 434 of each finger are adapted to be proximate an edge of the integrated circuit. A corner web 435 interconnects the positioning fingers 431 and 432 at a lower portion thereof leaving a corner gap 436. That is, the positioning fingers 431 and 432 lie along intersecting finger axes, but are spaced from the intersection of those axes. Each of the positioning fingers 431 and 432 additionally includes chamfered surfaces, designated as chamfered surfaces 437 and 438 on the positioning fingers 431 and 432, respectively.

The positioning fingers 431 and 432 additionally carry, as integrally molded components, pedestals 440 and 441 and pedestals 442 and 443, respectively. Top surfaces or platforms, such as the surface or platform 444 on the pedestal 440, each define a corner support plane. Similar pedestals on each of the other corner supports 422 (1), 422 (2) and 422 (4) also define corner support planes. All the corner support planes are coplanar. Thus, these platforms, such as the platform 444, define, collectively, a support plane for the housing 401. Specifically, the platforms engage the bottom surface 403 of the integrated circuit housing 401 along the edges thereof. The platforms 444 are spaced from the base plate 421 by a distance that is greater than the predetermined length of the terminal pins 402 shown in FIGS. 1 and 2.

The corner support 422 additionally includes two upstanding ribs 450 and 451. The ribs 450 and 451 extend along parallel axes 452 and 453 respectively. Moreover, the upstanding ribs at the corner supports 422 (1) and 422 (3) are coaxial. That is, the upstanding rib 450 lies on the same axis 452 as a corresponding rib in the corner support 422 (1) that is diagonally opposed to the corner support 422 (3) while the rib 451 lies on the same axis 453 as a corresponding rib in the corner support 422 (1). Similar axes 454 and 455 define the locations of corresponding upstanding ribs at each of the diagonally opposed corner supports 422 (2) and 422 (4) lie on rib axes 454 and 455. The axes 452 and 453 associated with either of the corner supports 422 (1) and 422 (3) also intersect the rib axes 454 and 455 associated with adjacent ones of the corner supports 422 (2) and 422 (4) at right angles or perpendicularly. Thus there are two upstanding ribs along each axis, such as the upstanding rib 450 in the corner structure 422 (3) and a corresponding upstanding rib in the corner structure 422 (1) that lie along the rib axis 452.

Referring again to FIG. 5, the base plate 421 supports the ribs 450 and 451 in an upstanding fashion with upper chamfered or tapered edges 456 and 457 on the ribs 450 and 451 respectively. The upper chamfered edges 456 and 457 lie intermediate the base plate 421 and the support plane at the platform 444. The upper edges 456 and 457 are spaced from the upper edge of the positioning fingers 431 and 432 by a distance that is greater than the predetermined pin length.

Referring to FIGS. 4 and 5, as an integrated circuit 400 such as shown in FIG. 1 is loaded into a storage pocket area, such as the storage pocket area 420 (2) in FIGS. 4 and 5, the first physical contact is between the edges of the housing 401 and the chamfered edges 431 and 432. This occurs before the ends of the terminal pins 402 reach the upper chamfered or tapered edges 456 and 457. The positioning fingers, such as the positioning fingers 431 and 432, collectively provide a rough alignment of the housing 401 with respect to the upstanding ribs 450 and 451. This positioning provides sufficient placement accuracy to assure that the chamfered or tapered edges 456 and 457 will be located essentially between adjacent oblique rows of terminal pins. As the integrated circuit housing is lowered, the upstanding ribs, such as the upstanding ribs 450 and 451, provide a final rotational position relative to the storage pocket area and hence to the tray 410. The platforms, like the platform 444 eventually engage the housing 401.

Figure 6:
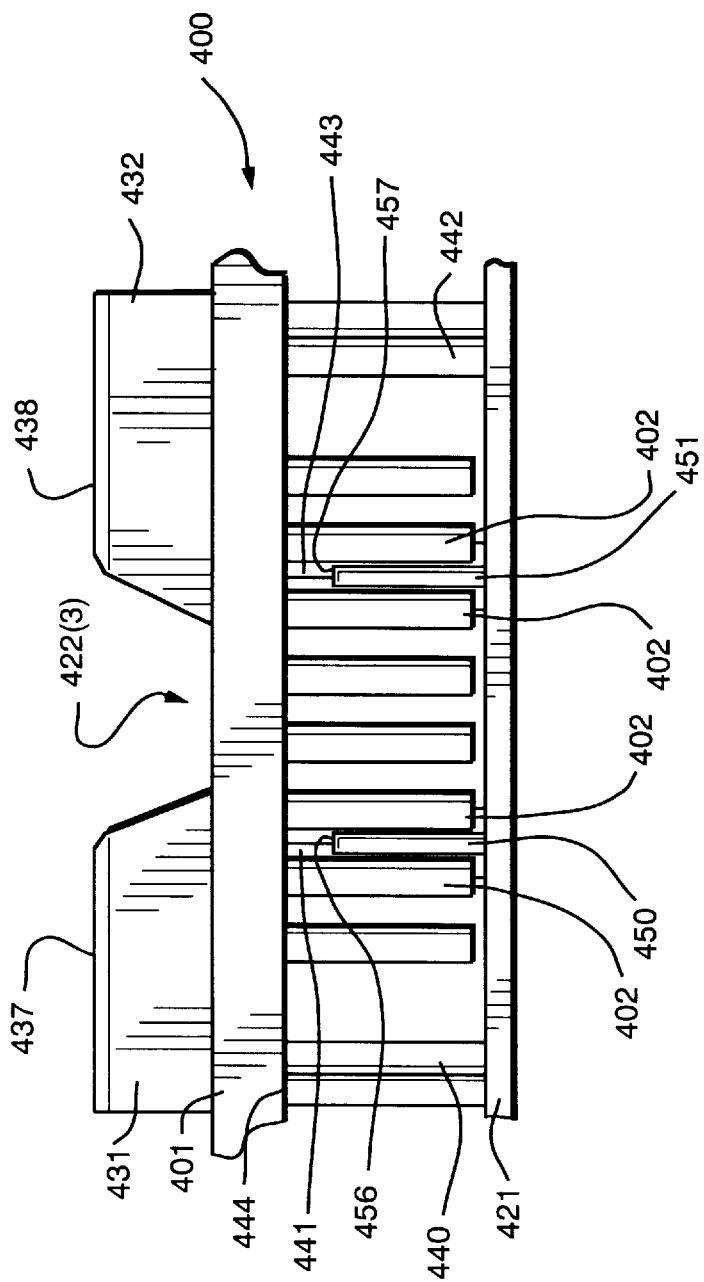
FIG. 6 is a plan view of a portion of a storage pocket shown in FIG. 5 carrying an integrated circuit component as shown in FIGS. 1 and 2.

Referring now to FIG. 6, the upstanding ribs, such as the upstanding ribs 450 and 451, collectively provide accurate pin positioning relative to the tray 410 as they are precisely located intermediate adjacent rows of the terminal pins. Thus robotic systems are able to use the tray 410 as a reference for determining the relative orientation of the integrated circuit even though the terminal pins 402 in FIG. 1 are hidden from direct viewing. This greatly facilitates the subsequent removal of the integrated circuit component from the tray 410 for positioning on a circuit board. The gaps 436, as shown in FIG. 5, are coextensive with the space above the platforms, such as the platform 444. The gaps receive the corners of the housing 401 and enable the rotation of the integrated circuit 400 without interference between any supporting structure and the corners of the integrated circuit.

Still referring to FIG. 5, the upper chamfered surfaces 456 and 457 are parallel to the base plate and spaced slightly below the support plane of the upper platforms, such as the platform 444. Consequently the upstanding ribs 450 and 451 do not provide a housing support function. However, the resulting spacing provides another advantage. If any pins are bent during manufacture and an individual forces the integrated circuit into a storage pocket area, any terminal pins that interfere with the upstanding ribs 450 and 451 can be bent further. If the upstanding ribs 450 and 451 were to perform a housing support function, the terminal pins could be bent tightly against the housing and therefore not be repairable. The spacing eliminates tight bending and does enable the pins to be straightened without loss of the entire electronic integrated circuit even if they are bent when the integrated circuit is placed in the tray.

Thus each tray in FIGS. 3 through 6 is a rigid planar structure that defines a common planar support for a plurality of integrated circuits. Each of the integrated circuits has a thin planar housing and an array of terminal pins extending therefrom. Each tray includes upstanding ribs that are positioned between adjacent rows of the depending terminal pins to provide fine or accurate positioning of the terminal pins relative to the tray thereby to facilitate subsequent replacement of the integrated circuit on a circuit board when it is removed from the tray by robotic or type devices.

These trays can be constructed of a number of different materials. That is, each tray can be molded from a filled, dimensionally stable thermoplastic material. As previously indicated, such a material can include those materials taken from the group consisting of polyether sulfones, polyether imides, polyaeryl sulfones and polyesters having a filler from the group consisting of carbon and aluminum. Styrenes such as acrylonitrile butadiene styrene, also are acceptable.

It also will be apparent that a number of modifications can be made while obtaining some or all of the advantages of this invention. For example, a tray may include different structures for defining storage pocket areas of differing configurations. The upstanding ribs may have a taper or no taper. The depth of each storage pocket area may have a different relationship to both the terminal pin length and overall height of the component. Still other materials may be substituted for the specifically disclosed materials. Therefore, it is the intent of the appended claims to cover all such variations and modifications as come within the true spirit and scope of this invention.

What is claimed as new and desired to be secured by Letters Patent of the United States is:

1. A tray for storing at least one integrated circuit component, each integrated circuit component having a planar, rectangular housing with spaced planar surfaces bounded by edges and an array of spaced terminal pins of predetermined length extending substantially normally to one planar surface of the housing in spaced parallel rows that are oblique to the housing edges, said tray comprising:
    A. dimensionally stable framework means for defining at least one storage pocket area,
    B. a base support means in each storage pocket area supported by said framework means, and
    C. corner support means extending normally to said base support means located to be in register with the corners of one integrated circuit component housing for supporting the integrated circuit housing relative to said base support means and precisely positioning the terminal pins relative to said tray, each said corner support means comprising:
        i. first positioning means for orienting the terminal pins precisely with respect to said tray,
        ii. second positioning means for engaging the housing to guide the terminal pins into register with said first positioning means, and
        iii. housing support means for engaging the housing thereby to position the integrated circuit component in a direction transverse to the housing and said base support means.

2. A tray as recited in claim 1 wherein said first positioning means at each said corner support means include a plurality of upstanding ribs lying along spaced, parallel rib axes that are oblique to said framework means, upstanding ribs at diagonally opposed corner support means lying on the same set of spaced, parallel rib axes and said spaced, parallel rib axes from one corner support means intersecting the spaced parallel rib axes from an adjacent corner support means.

3. A tray as recited in claim 2 wherein said ribs are positioned interiorly of said second positioning means and to be coextensive with the terminal pins adjacent said corner support means.

4. A tray as recited in claim 3 wherein said second positioning means comprise first and second upstanding fingers having free edges parallel to said base support means chamfered.

5. A tray as recited in claim 4 wherein each of said first and second upstanding fingers lie on intersecting finger axes.

6. A tray as recited in claim 5 wherein each of first and second upstanding fingers are spaced from the intersection of the finger axes.

7. A tray as recited in claim 4 wherein said housing support means is located interiorly of said second positioning means and comprises a plurality of pedestals each having a support surface that is parallel to and spaced from said base support means.

8. A tray as recited in claim 7 wherein each said support surface is coplanar and spaced from said base support means by a distance greater than the terminal pin predetermined length.

9. A tray as recited in claim 8 wherein each of said upstanding ribs at said corner support means extends normally from said base support means to a position intermediate said base support means and said support surfaces.

10. A tray as recited in claim 9 wherein each of said fingers extends normally to said base support means to terminate at a position above said base support means that is spaced above said upstanding ribs by a distance greater than the predetermined length of the terminal pins.

11. A tray for storing a plurality of integrated circuit components, each integrated circuit component having a planar, square housing with spaced planar surfaces bounded by edges and an array of spaced terminal pins of a predetermined length extending substantially normally to one planar surface of the housing in spaced parallel rows that are oblique to the housing edges, said tray comprising:
    A. a dimensionally stable, rigid lattice framework defining a plurality of storage pocket areas,
    B. a planar base plate spanning each storage pocket area, said framework supporting said base plates in said plurality of storage pocket areas in a coplanar relationship, and
    C. a corner support extending normally to each said base plate to register with the corners of a housing, each said corner support comprising:
        i. first and second upstanding positioning fingers on said base plate, each said positioning finger having an edge parallel to and spaced from said base plate by a first dimension and each of said first and second fingers lying along intersecting finger axes,
        ii. a plurality of upstanding support pedestals located at each of said fingers, each said pedestal having a planar surface parallel to and spaced from said base plate by a second dimension, all of said planar surfaces being coplanar, and
        iii. a pair of upstanding ribs extending along rib axes parallel to and spaced from a diagonal intersecting diagonally positioned corner supports, each rib axis defining the position of one rib at each corner structure, each of said ribs having an edge parallel to said base plate and spaced therefrom by a third dimension.

12. A tray as recited in claim 11 wherein the second dimension of said support surfaces corresponds to the predetermined terminal pin length such that the terminal pins are spaced from said base plate when said support surfaces engage the housing, the third dimension being less than the second dimension and the first dimension being greater than the third dimension plus the terminal pin length.

13. A tray as recited in claim 12 wherein each of said ribs has a thickness that corresponds to the spacing between adjacent rows of terminal pins and each of said ribs is spaced by a distance that corresponds to the spacing between spaced rows of terminal pins.

14. A tray as recited in claim 13 wherein each of said fingers and ribs include a base portion and a chamfered portion at each of the edges thereof.

15. A tray as recited in claim 13 wherein a plurality of said pedestals extends laterally from each of said fingers and wherein each of said ribs extends laterally from one of said pedestals.

16. A tray as recited in claim 15 wherein each of said fingers and ribs include a base portion and a chamfered portion at each of the edges thereof.

17. A tray as recited in claim 16 wherein said framework includes beam portions defining the periphery of each storage pocket area and said base plate includes a central portion and a plurality of web portions for connecting said central portion to adjacent ones of said beam portions.

18. A tray as recited in claim 17 wherein said tray is formed of an insulating, dimensionally stable molded thermoplastic material having a conductive filler.

19. A tray as recited in claim 18 wherein said thermoplastic material is taken from the group consisting of styrenes, polyether sulfones, polyether imides, polyaeryl sulfones and polyesters and said conductive filler is taken from the group consisting of carbon and aluminum.

20. A tray as recited in claim 17 wherein outer framework beam portions define the outer periphery of said tray, each of said outer beam portions having complementary structures for enabling tray stacking.

* * * * *